United States Patent [19]
Wilke

[11] Patent Number: 5,267,189
[45] Date of Patent: Nov. 30, 1993

[54] RATIONAL FRACTION SYNTHESIZER

[76] Inventor: William G. Wilke, 24 Prescott St., Arlington, Mass. 02174

[21] Appl. No.: 769,093

[22] Filed: Sep. 30, 1991

[51] Int. Cl.⁵ .............................................. G06G 7/16
[52] U.S. Cl. ................................................... 364/851
[58] Field of Search ...................... 364/851, 718, 703; 328/14

[56] References Cited

U.S. PATENT DOCUMENTS

| | | | |
|---|---|---|---|
| 4,234,929 | 11/1980 | Riley, Jr. | 364/703 X |
| 4,464,638 | 8/1984 | Crowley | 331/1 A |
| 4,668,922 | 5/1987 | Crawford | 331/1 A |
| 4,673,892 | 6/1987 | Miyashita | 331/14 |
| 4,951,005 | 8/1990 | Babin | 331/16 |
| 5,088,057 | 2/1992 | Amrany et al. | 364/703 |
| 5,128,623 | 7/1992 | Gilmore | 364/851 X |

OTHER PUBLICATIONS

Rohde, *Digital PLL Freq. Synthesizers* Prentice Hall (1983).
Mannassewitsch; *Freq. Synthesizers: Theory and Design* (1987).
Helfrich; *A High Performance Synth 2-meter Transmitter* (1980).
Hayward; *R.F. Design Techniques.*
Kroupa; *Frequency Synthesis, Theory, Design and Applications* (1973).
Sterling; *Microwave Frequency Synthesizers* (1987).

*Primary Examiner*—Tan V. Mai

[57] ABSTRACT

A frequency synthesizer with at least one main Phase Locked Loop (PLL), where the PLL has programmable dividers in both its input path (M) and its feedback path (N), and where the main PLL is driven by a reference source of frequency $F_{ref}$ and has output $F_{out} = N/M * F_{ref}$, and each of the programmable counters is controlled by a calculation and control device. The synthesizer uses a method to produce an output frequency $F_{out}$ that is a close approximation to a requested frequency $F_{req}$, including calculating several integer approximations $N_i/M_i$ to the ratio $F_{req}/F_{ref}$, and picking the best approximation where the values of $N_i$ and $M_i$ are both still small enough to be used to program the two programmable counters. In another form of the invention, there is an adjustable reference source which can provide a plurality of reference frequencies $F_{refj}$ under control of the calculation and control device. Here, a value of $F_{refj}$ is chosen, and then the approximation and picking steps are run, followed by a calculation of the resulting error (err = $F_{out} - F_{req}$). Then, by selecting a new $F_{refj}$, the procedure can be run again, resulting in a new err value. After several runs, each with its assigned error, one of the low error runs can be chosen, and the corresponding $M_i$ and $N_i$ values used the program the counters.

13 Claims, 8 Drawing Sheets

FIG. 6A

| $F_{REF}$ (MHz) | i | $N_i/M_i$ | $N_i/M_i \cdot F_{REF}$ (MHz) | ERR (=$F_{REQ}$-$F_{OUT}$) (Hz) |
|---|---|---|---|---|
| 10.0000 | 1 | 2/1 | 20.000000 | ~1890 Hz (~95 ppM) |
| 10.0000 | 2 | 10581/5291 | 19.999811 | ~zero |

FIG. 6B

| | $F_{REF}$ (MHz) | i | $N_i/M_i$ | $N_i/M_i \cdot F_{REF}$ (MHz) | ERR (=$F_{REQ}$-$F_{OUT}$) (Hz) |
|---|---|---|---|---|---|
| 1 | 10.0000 | 1 | 2/1 | 20.000000 | ~1890 Hz (~95 ppM) |
| 1 | 10.0000 | 2 | 10581/5291 | 19.999811 | ~zero |
| 2 | 10.001100 | 1 | 2/1 | 20.0022 | -4090 Hz (-.204 ppM) |
| 2 | 10.001100 | 2 | 4889/2445 | 19.998810957 | ~.43 Hz (-.022 ppM) |
| 2 | 10.001100 | 3 | 14669/7336 | 19.998811013 | ~-.13 Hz (-.007 ppM) |

| I | T | X | E | Y | F | A | B | X/Y*10 |
|---|---|---|---|---|---|---|---|---|
| 0 | 6 | 1 | 0 | 0 | 1 | 6,045,204 | 1,000,000 | |
| 1 | 22 | 6 | 1 | 1 | 0 | 45,204 | 1,000,000 | 60.000000 |
| 2 | 8 | 133 | 6 | 22 | 1 | 5512 | 45204 | 60.454545 |
| 3 | 4 | 1070 | 133 | 177 | 22 | 1108 | 5512 | 60.4519774 |
| 4 | 1 | 4413 | 1070 | 730 | 177 | 1080 | 1108 | 60.4520548 |
| 5 | 38 | 5483 | 4413 | 907 | 730 | 28 | 1080 | 60.4520397 |
| 6 | | 212767 | 5483 | 35196 | 907 | 16 | 28 | 60.452040 |

FIG. 8

RATIONAL FRACTION SYNTHESIZER

BACKGROUND OF THE INVENTION

1. Field of the Invention

This invention relates to frequency synthesizers and more particularly to a synthesizer which is capable of being programmed or set at a desired frequency by means of calculated input controls.

2. Cross Reference to Related Applications

The inventor's application (Ser. No. 07/769,093 Dual Synthesizer), submitted on Sep. 30, 1991, after the present application, and issued Sep. 1, 1992 as U.S. Pat. No. 5,144,254, is incorporated herein by reference.

3. Description of the Prior Art

The frequency synthesizer is a well known and widely used electronic subsystem. Basically, frequency synthesis involves two distinct approaches, sometimes referred to as direct synthesis and indirect synthesis. Mostl such synthesizers utilize a source of reference frequency, such as a quartz oscillator, or atomic standard, or some other highly accurate, fixed frequency reference. The source frequency itself is then operated on to provide a wide band of frequencies, each possessing the stability or accuracy of the source. In the direct synthesis approach, the designer may employ dividers, multipliers and such devices which operate on the frequency standard to derive the required output range of frequencies.

In the indirect approach, a VCO or controllable oscillator or other tunable source is used as a generator of the frequency range desired and this is then locked to the source by means of a frequency locked or phase locked loop. Thus one need not utilize complicated filtering schemes as is necessary in the direct synthesis approach.

While the frequency synthesizer is characterized above as a separate test instrument, the same art has found widespread use in the communications field as a local oscillator for a radio receiver or transmitter. A good description of some representative synthesizer techniques appear in books such as *Digital PLL Frequency Synthesizers* by Ulrich L. Rohde (1983); *Frequency Synthesizers: Theory and Design* 3rd. Ed. by Vadim Manassewitsch; and *Microwave Frequency Synthesizers* by Ronald C. Sterling.

A commonly used prior art frequency synthesizer is the conventional divide-by-N phase locked loop design that generates frequencies which are multiples of a reference frequency. More specifically, such a frequency synthesizer consists of a voltage (or current) controlled oscillator (VCO), divide-by-N logic which divides the output frequency of the VCO by N to produce a signal of frequency $F_c$, and a phase (and or frequency) detector which receives the divided signal at one input thereof and the reference frequency signal of frequency $F_{ref}$ at the other input thereof. The output of the phase detector is supplied back to the frequency control input of the VCO through a loop filter so that the output frequency of the VCO, after being divided by N, is equal to the frequency of the reference signal, or $F_c = F_{ref}$. By changing the value of N, $F_{out}$ can be changed in frequency steps equal to $F_{ref}$.

In most of the prior art, the frequency resolution of the PLL is equal to $F_{ref}$, and there is a tradeoff between resolution and locktime, noise suppression etc. An exception in the prior art is the fractional synthesis technique, but such art is typically expensive both in terms of cost and power.

The prior art also includes the ability to divide a reference signal by M before it is input to the phase detector at a comparison frequency $F_c$. This is done because the best frequencies for building good reference clocks (e.g.: 3 to 5 MHz for crystals) are often not the best frequencies for comparison $F_c$. Thus an M divider is often used to divide down from the best $F_{ref}$ frequency to the chosen $F_c$; but it is fixed at one value—or ocassionally two—, when two different $F_c$'s are to be provided. Thus even if the prior art apparatus allowed M to be programmed, said programming was done just once, and not updated for each new requested $F_{out}$. To improve the frequency resolution of such prior art synthesizers, the designer must decrease $F_c$, but many important characteristics such as speed of lock, noise rejection (especially microphonics), $F_c$ spur rejection, and so on limit the amount by which $F_c$ can be reduced. This same kind of tradeoff exists even in the present invention, but the teaching of this invention makes the tradeoff much less strict Other prior art combines a single PLL and a variable timebase. This may take any of several forms. First, a single PLL may be driven by a direct digital synthesizer (DDS) subsystem used as a variable timebase, wherein the PLL becomes a "course" loop, while the DDS forms a "fine" source. The DDS is called on to "fill in the steps" between the "course" steps of the PLL. Such art has become more popular, but it still is expensive and still has inherent noise problems. Another version uses a PLL driven by a variable clock consisting of a crystal oscillator that is "pulled" by a small amount, again to effectively fill in between the "course" steps of the final loop. Though this latter technique is less expensive and does not have the noise problems of the DDS technique, it does have at least three problems of its own: First, the output is now based not on a high quality stable source, but rather on a "pulled" crystal, so overall accuracy and stability are compromised. Second, an "external timebase in" cannot be used, because the "pulled" crystal is not locked to anything. Third, an "internal timebase out" cannot be provided, because none exists; the "pulled" crystal signal is of little value to a user, because it is not constant or at a "standard" frequency. And even if a user just used it relative to the overall synthesizers output, said overall output would then fall back to only having "course" resolution relative to the (variable) timebase out.

Another characteristic of prior art variable clocks, is that they must be designed to have their step size constant, or nearly so, whereby the gaps in between the "course" steps can be filled in evenly. The "steps" of the present inventions adjustable timebase are not required to be even, as will be described below.

Additionally, there is prior synthesizer art where the synthesizer produces an output $F_{out}$ that is a mathematical approximation of the requested frequency. Such prior art, however, does not teach how to make a given approximation better. Several prior art synthesizers do use a "clock pulling" scheme to further improve resolution of $F_{out}$, but this does not lead to any better mathematical approximation, rather they attempt to compensate for the errors resulting from their fixed approximations, and they exhibit the drawbacks detailed above.

OBJECTS AND SUMMARY OF THE INVENTION

An object of the invention is to provide a low cost synthesizer that produces a low noise, high resolution signal over a wide frequency range.

Another object of the invention is to provide a synthesizer that produces the desired output signal resolution using fewer phase-locked loop circuits than currently known art.

Yet another object of the invention is to provide a synthesizer with resolution better than that of a single approximation synthesizer.

A further object of the invention is to provide a synthesizer with a timebase of a standard frequency, to allow the use of a "ext. in" and/or a "int. out" feature.

In accordance with an aspect of the present invention, there is provided, in a frequency synthesizer comprising at least one main PLL, where said PLL has programmable dividers in both its input path and its feedback path, and where said main PLL is driven by a reference source of frequency $F_{ref}$ and has output $F_{out} = N/M * F_{ref}$, where M and N are the division values of the two programmable counters (reference divider and feedback divider respectively), and each of the programmable counters is controlled by a calculation and control means, a method to produce an output frequency $F_{out}$ that is a close approximation to a requested frequency $F_{req}$, by receiving $F_{req}$, calculating several rational fraction approximations $N_i/M_i$ to the ratio $F_{req}/F_{ref}$, and picking the best approximation where the values of $N_i$ and $M_i$ are both still small enough to be used to program the two programmable counters, generating the several signals, and dividing them by said integers, locking said loop, and thereby producing said approximate output signal $F_{out}$.

In accordance with another form of the invention, there is provided an adjustable reference which can provide a plurality of reference frequencies $F_{refj}$ under control of said calculation and control means. In this form of the invention, a value of $F_{refj}$ is chosen, and then the approximation and picking steps are run, followed by a calculation of the resulting error (err = $F_{out} - F_{req}$). Then, by picking a new $F_{refj}$, the proceedure can be run again, resulting in a new err value. After a plurality of runs, each with its assigned error, one of the better ones (e.g.: where $F_{out} - F_{req}$ is smaller than some limit) can be chosen, and the corresponding $M_i$ and $N_i$'s used the program the counters.

The forgoing as well as other objects, features and advantages of the present invention will be apparent form the following, more particular description of the prefered embodiments of the invention, as illustrated in the accompanying drawings.

BRIEF DESCRIPTION OF THE DRAWINGS

FIG. 6A is a table illustrating a sample calculation according to the single reference version of the invention.

FIG. 6B is a table illustrating a sample calculation according to the adjustable reference version of the invention.

FIG. 8 is a table illustrating a sample calculation according to the proceedure of FIG. 7.

DESCRIPTION OF THE PREFERRED EMBODIMENTS

Figure 1A:
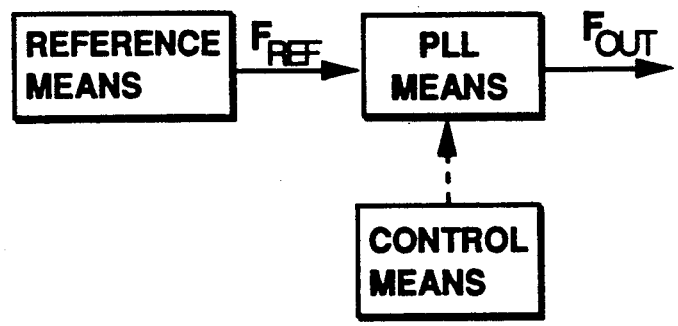
FIG. 1A is a schematic block diagram of a prior art synthesizer.
Figure 1B:
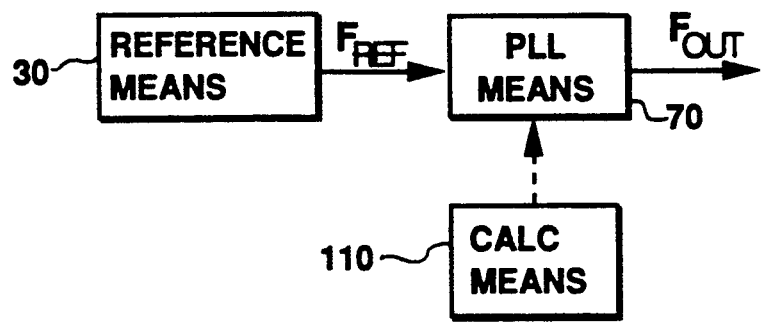
FIG. 1B is a schematic block diagram of a synthesizer constructed according to a single reference embodiment of the present invention.
Figure 1C:
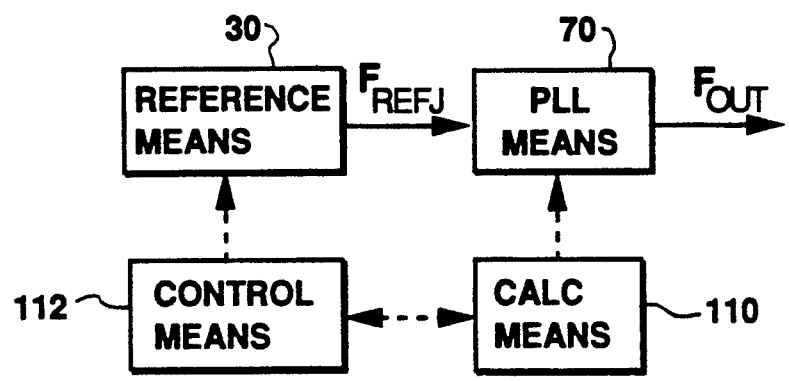
FIG. 1C is a schematic block diagram of a synthesizer constructed according to an adjustable reference embodiment of the invention.
Figure 2:
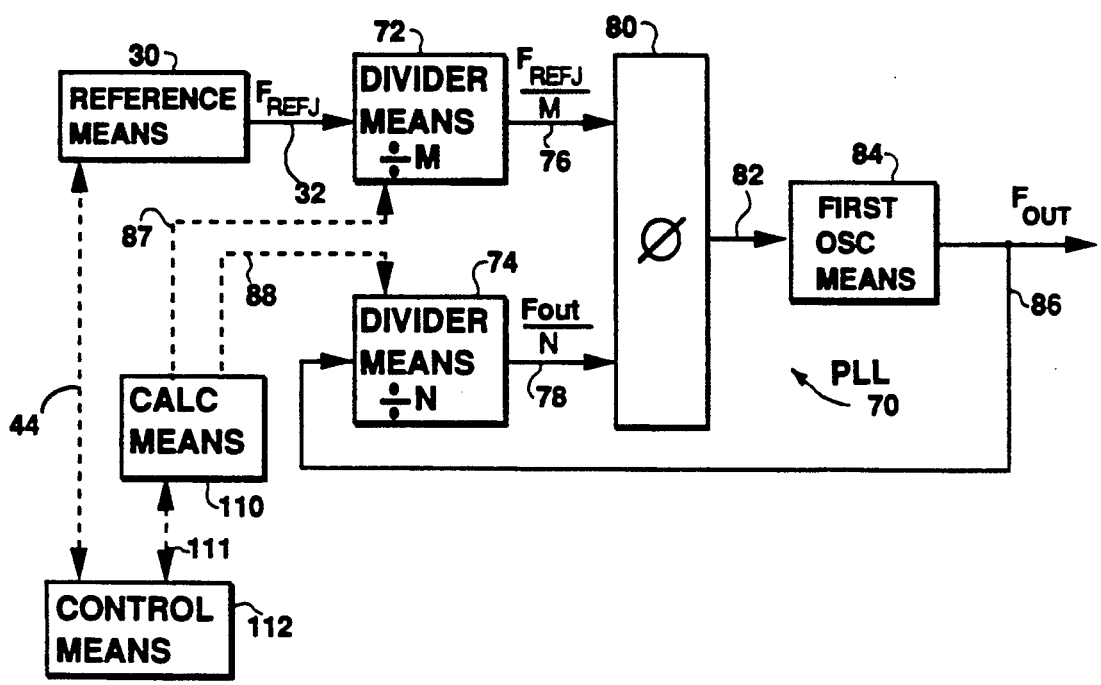
FIG. 2 is a more detailed block diagram of a synethesizer constructed according to the present invention.

FIG. 2 shows a detailed block diagram of the invention. As shown in FIG. 2, the output $F_{refj}$ 32 of a reference means 30, with a reference frequency $F_{refj}$ is applied to input terminals of a 1/M programmable divider 72. Divider means 72 can be programmed by control lines 87, to divide by a range of integers, from $M_{min}$ to $M_{max}$, and, like divider 74, can be any form of binary, decimal, straight, dual modulus, multi-modulus, or even analog divider, as long as it is programmable under the control of 110. Divider output 76, at a divided down frequency of $F_{refj}/M$, is applied to an input of a phase and filter means 80. Said means are known in the art, and may contain a phase detector responsive to inputs 76 and 78, and generating a signal 82 appropriate to drive controllable oscillator 84. Phase and filter means 80 may instead be a frequency detector, responsive to a frequency difference between inputs 76 and 78 or it might be a combination of phase and frequency detector; each is known in the art. Said means 80 might also include integrators, filters, and amplifiers to further condition the signal to be output at 82. Such means are known in the art in many different forms, and block 80 (and block 58 FIG. 3C when used) is intended to represent such prior art circuitry. The control signal 82 drives an output oscillator means 84 which is a controlled oscillator, whose output frequency $F_{out}$ at 86 is responsive to the control signal at 82. Typically 84 is a voltage controlled oscillator (VCO) or sometimes a current controlled oscillator. Output $F_{out}$ is available to the user, and is also connected to the input of divider means 74 of PLL 70. Buffer, amplifier, or isolator means that might be useful here, are not shown. Divider means 74 divides said input 86 by N and provides an output 78 of frequency $F_{out}/N$. 78 forms a second input to phase and filter means 80, and thereby closes the loop of PLL 70. When PLL 70 is locked, the inputs 76 and 78 are constrained to be at the same frequency, and thus $F\text{refj}/M = F\text{out}/N$ or $$F_{out} = (N/M) * F_{refj} \qquad (1)$$

Also shown in FIG. 2 is a calculation means 110 that calculates anew, for each new request for a frequency $F_{req}$, appropriate values for M and N. Said values are then programmed into programmable dividers 72 and 74 via data paths 87 and 88 respectively. A control means 112 can, in some embodiments, send instructions on lines 44 to change the frequency of reference means 30. Said control means has stored the control values necessary to command reference 30 to produce any of a plurality of reference signals $F_{refj}$. Reference 30 will be described below. Control means 112 may be the same apparatus as calculation means 110; for example 110 and 112 may be a single microprocessor or embedded controller. In any case, there is a close operative interaction between them, as indicated by line 111. The distinction intended by separating 110 and 112 schematically, is that the control 112 is limited to stored values for sending on 44 to 30 (typically under 20 pair of such values), or similarly in FIG. 3C controlling means 64 via control 44 to provide said values, whereas calculation means 110 actually calculates the values it sends out on lines 87 and 88. The method by which calculator 110 choses $F_{refj}$ values and calculates M and N is described below.

Figure 3A:
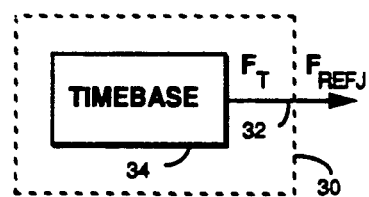
FIG. 3A shows a reference means consisting of a single timebase at one known frequency in accordance with an embodiment of the invention.

FIG. 3A shows a reference means 30 according to the single clock embodiment of the invention. It is a single reference timebase as known in the art. 34 might comprise a crystal oscillator, and ovenized crystal oscillator (OCXO), a temperature compensated crystal oscillator (TCXO), or some more exotic stable timebase. In the embodiment of 3A, there is no control line 44, as there is just the single reference frequency $F_t$ available on line 32.

Figure 3B:
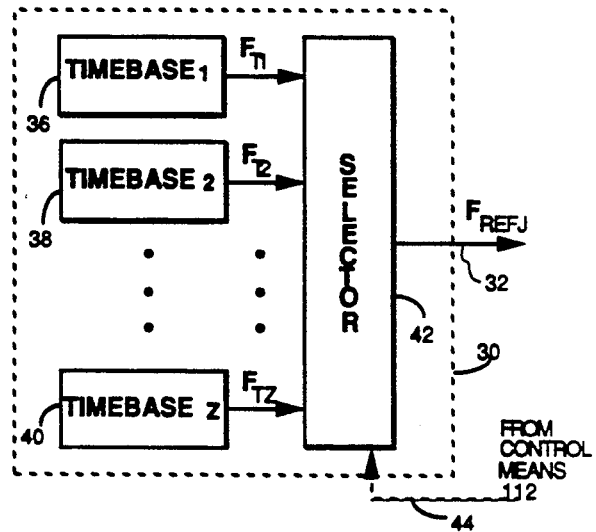
FIG. 3B shows a reference means comprising a plurality of timebase means and a selector means operating according to an adjustable reference embodiment of the invention.
Figure 3C:
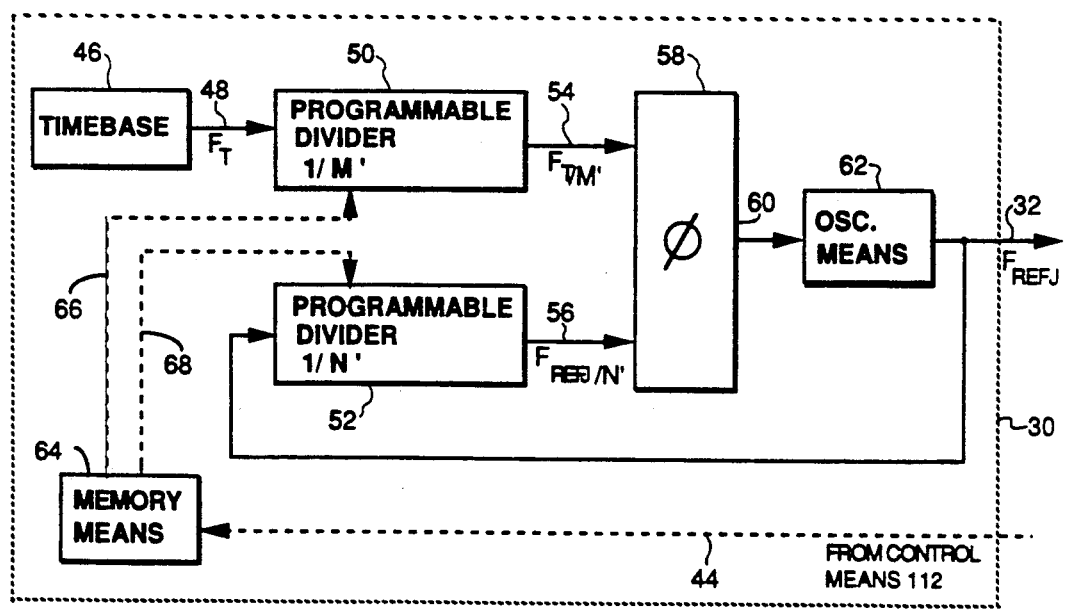
FIG. 3C shows a reference means comprising a timebase means, a phase-locked loop means and a memory and control means with a plurality of stored settings, operating according to an adjustable reference embodiment of the invention.

In the second embodiment of the present invention (described in "operation" below), it is desirable to have available more than one reference frequency. FIG. 3B and FIG. 3C show an adjustable reference means 30, designed to deliver, at different times, more than one reference frequency $F_{ref}$ on line 32. In FIG. 3B, said plurality reference comprises a plurality of individual timebases 36, 38, . . . , 40, of number two or greater, a selector means 42 with a plurality of inputs connected respectively to the outputs of said individual timebases, and with a single output 32. Said selector is responsive to control lines 44 from control 112, and under said control, it connects the chosen timebase to output line 32. In FIG. 3B, each timebase may comprise a crystal oscillator, or a TCXO, or an OCXO etc. Each oscillates at a frequency different from all the others, and the frequency of each ($F_{ref1}, F_{ref2}, \ldots F_{refz}$) is stable and known to the calculation means 110. The frequency variation between the largest and smallest $F_{ref}$ might typically be about 0.01% of $F_{ref}$, but this might change with each particular embodiment of the invention. As will be seen below, there is no requirement that $F_{refj} - F_{refj-1}$ = constant, since according to the present invention, each new $F_{ref}$ only must provide opportunity for a new and possibly better approximation to expressions containing $F_{ref}$; it is not required to evenly fill in "gaps" between "course" frequency steps as in some prior art. Also, the method of FIG. 3B does not generally allow for either an "external reference in", or an "internal reference out", though one particular $F_{ref}$ could be at a "standard" frequency and be favored in a limited way by the calculation proceedure. The advantage of the embodiment of FIG. 3B, is that for a small number of timebases, it could be less expensive than the scheme of FIG. 3C.

The cost of the adjustable reference shown in FIG. 3B goes up with each additional timebase that is added, and for embodiments requiring more than about three, another adjustable reference (FIG. 3C) may be preferable. In FIG. 3C, the adjustable reference signal 32 is generated by a PLL. A single timebase 46, which may be a crystal oscillator, OCXO, TCXO, exotic timebase, "external timebase in", or other, has output 48 of frequency $F_t$ connected to programmable divider means 50 wherein it is divided by $M_j'$ and output on line 54 at frequency $F_t/M_j'$. Line 54 connects to an input of the phase and filter means 58. The output of said phase and filter means is control line 60, responsive to the phase and/or frequency difference between inputs 54 and 56, and appropriate to drive oscillator 62 which may be a voltage controlled oscillator. The output 32 of said oscillator forms the output of the adjustable reference, and also connects to the input of programmable divider 52. Said dividers output is at 56, and has frequency $F_{refj}/N_j'$, and forms a second input to phase and filter means 58, and thereby closes the loop of the PLL. When the loop is locked, the inputs 54 and 56 are constrained to be at the same frequency, and therefore the design equation for the loop is: $F_t/M_j' = F\text{refj}/N_j'$ or:

$$F_{refj} = (N_j'/M_j') * F_t \qquad (2)$$

If controlled oscillator 62 is chosen to be a VCXO, then the signal out at 32 can have the excellent noise spectrum of a crystal oscillator, and in the prefered embodiment of the invention, oscillator 62 is a VCXO. Dividers 50 and 52 are programmed by control path 66 and 68 from memory means 64. Said memory provides said $M_j'$, $N_j'$ pairs, under control (44) of 112. Memory means 64 may be the same hardware as means 112 and/or means 110.

In the embodiment of FIG. 3C, the $F_{ref}$'s are determined by the choice of the values for the $N_j', M_j'$ pairs. As with multiple clocks of FIG. 3B, there is no requirement that $F_{refj} - F_{refj-1}$ = constant. Since the $N_j', M_j'$ are used in a PLL, there might be a noise or other advantage to limiting their size. Under this constraint, combined with the additional constraint that with a VCXO one is usually limited to $F_{refmax} - F_{refmin}$ perhaps 100 ppM), there is an advantage to having the range of the $F_{ref}$'s offset slightly from any multiple of $F_t$.

Typically, timebase 46 is chosen to be at a "standard" frequency such as 1 MHz, 5 MHz, or 10 MHz, and thus the frequency $F_t$ at 48 can be made available to the user as an "internal timebase out". Similarly, an "external timebase in" can be used in place of timebase 46, and as long as said input is a simple multiple or sub-multiple thereof, could be used by merely altering all the stored values of M' or N' so that the values of $F_{ref}$ 32 are unaffected.

Other possible oscillators known in the art could serve as adjustable references in the present invention, though I have not shown them explicitly. An example might be a free running VCXO driven by a D/A controlled by means 112 and calibrated such that means 112 "knows" the value of $F_{ref}$ that will result from various values sent to the D/A. Any such schemes must be able to provide and know the $F_{ref}$ values to an accuracy greater than the accuracy expected for the final $F_{out}$, since the further transformations to produce $F_{out}$ are directly proportional to the value of $F_{ref}$. So, though any adjustable reference that produces a plurality of $F_{ref}$'s that are controllable by 112 and "known" to the calculation means 110 is deemed covered by the invention, the prefered version is often that shown in FIG. 3C.

All of the PLL components heretofore mentioned, are known in the art. Also known to those skilled in the art, is that additional components such as buffers amplifiers, filters, splitters etc are often necessary for the optimal operation of said loops. These components have not been specifically described here because they are not the subject of the present invention, but they are assumed to be part of the loops where required. In addition, much prior art concerns itself with improving the electrical operation of PLL's, such as improving their speed of lock, decreasing their spurious noise, reducing their $F_c$ feedthrough, and so on. The present invention is independent of most of this art, but such art can still in many cases be profitably included in the PLL design when designing a synthesizer according to the teaching of the present invention.

OPERATION

The form of the PLLs is conventional as described above. The novel aspect of the present invention arrises in programming both dividers in the main PLL, and in their combination with an approximation and calculation proceedure to generate said divisors and, in the second embodiment, to control the reference source of the synthesizer, whereby to promote an improved approximation.

There are two versions of the calculation proceedure, hereinafter called "single-reference" and "adjustable reference". The hardware means previously described is similar for the two versions, except that in their prefered embodiments the reference means are different, as shall be described below. The present invention receives a frequency request $F_{req}$ and calculates an approximation thereto, with the goal that the output frequency satisfies $F_{out} \sim F_{req}$. Equation (1), the design equation for the present invention, can be combined with that approximation to give:

$$F_{req}/F_{ref} \sim F_{out}/F_{ref} = N_i/M_i \qquad (3)$$

The calculation proceedure must calculate two integers $M_i$ and $N_i$ which, at least approximately, satisfy equation (3), and yet are themselves small enough to be programmed into dividers 72 and 74.

Figure 4:
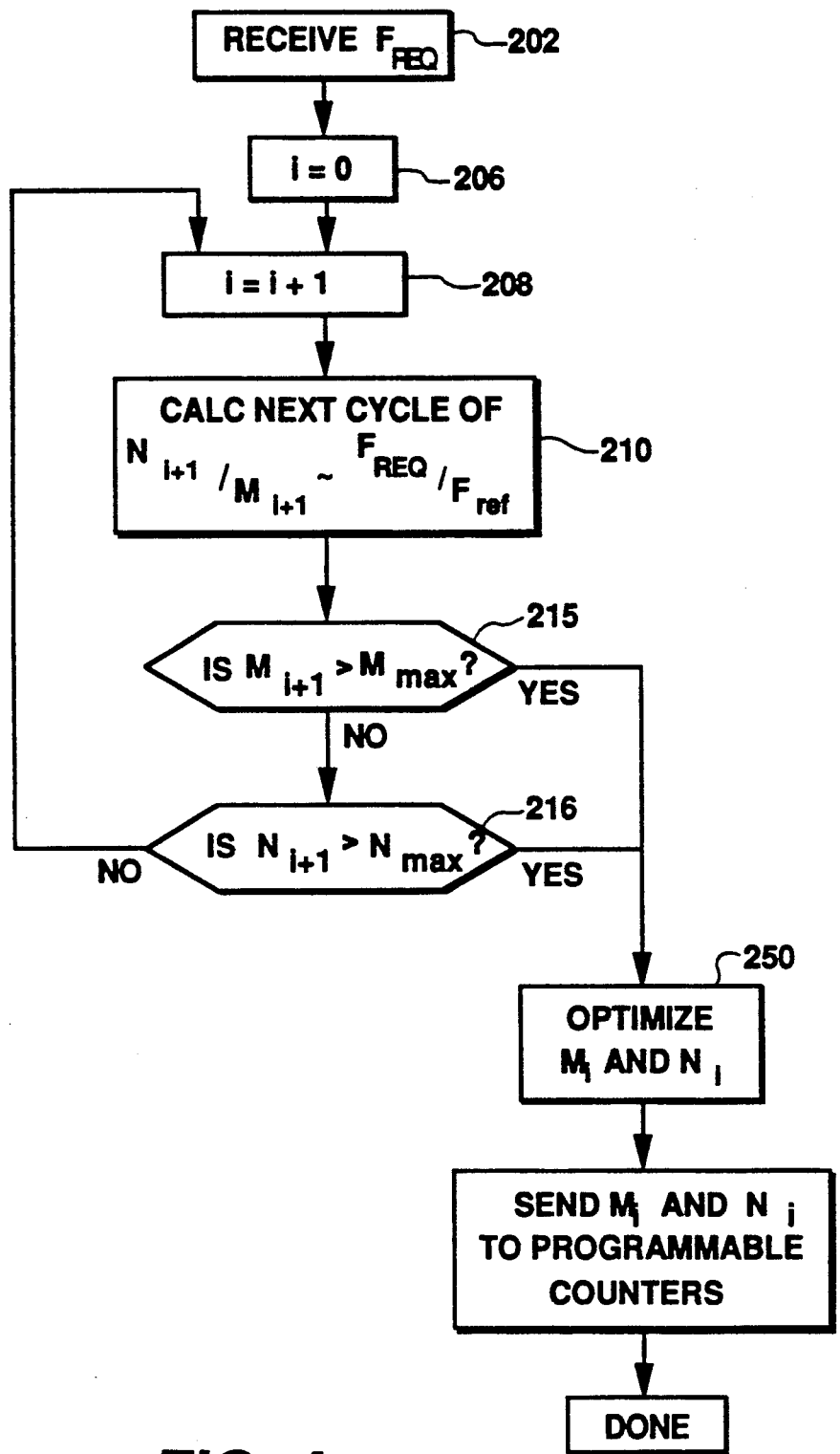
FIG. 4 is a flow chart description of the calculation proceedure for the single reference embodiment of the invention.
Figure 7:
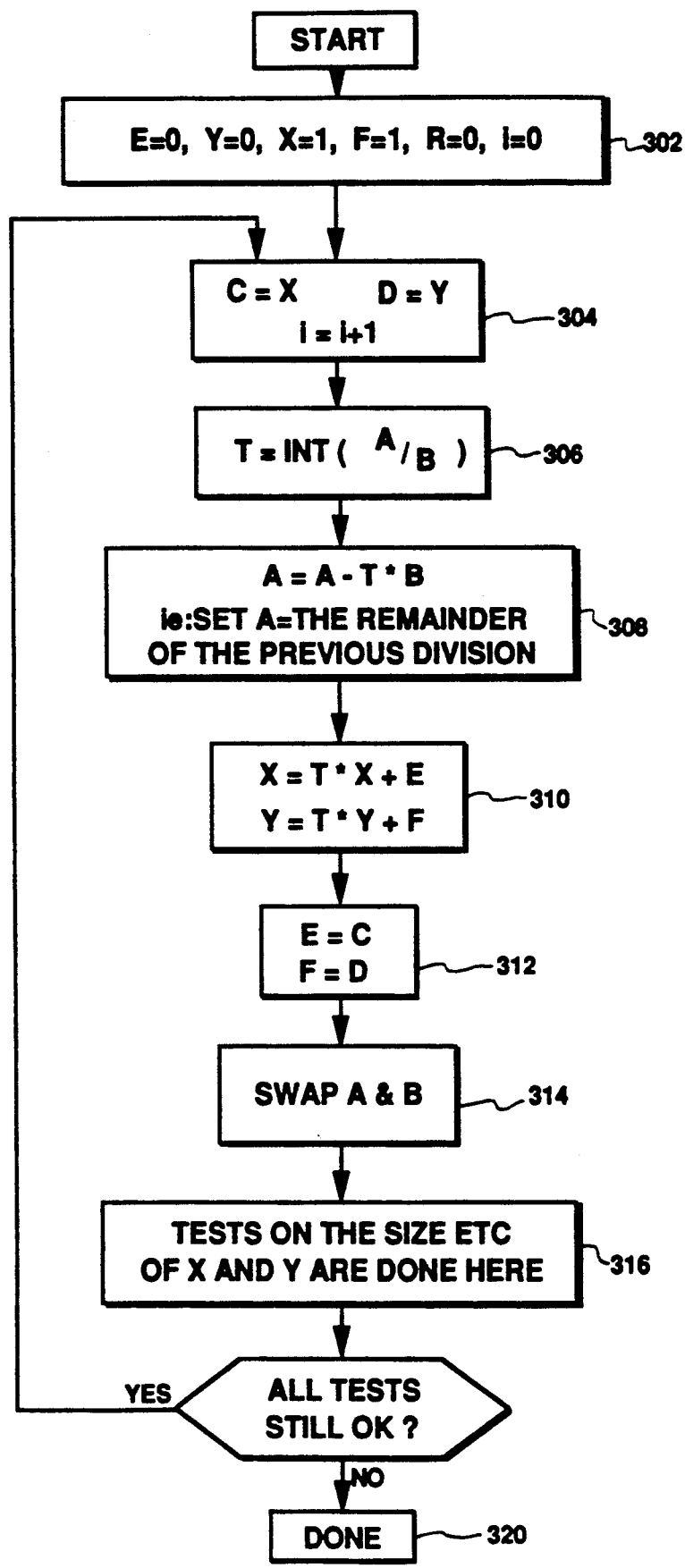
FIG. 7 is a detailed flow chart description of a rational fraction calculation proceedure of Block 210 of FIG. 4 and FIG. 5.

FIG. 4 shows the calculation procedure of the single clock version of the present invention. Upon receiving a request for a new output frequency $F_{req}$ (from hardware not shown), the procedure initializes values, including setting (at 206) the approximation index. Step 208 increments the approximation index, beginning the next cycle. Next, at 210, the i+1 st rational fraction approximation is performed, to calculate $M_{i+1}$ and $N_{i+1}$ which approximately satisfy equation (3). FIG. 7 and FIG. 8 detail step 210. Finally, the two integers $N_{i+1}$ and $M_{i+1}$ are tested to see if they have grown so large as to be no longer "acceptable" e.g.: too large to be fed to programmable counters 72 and 74. If said $N_{i+1}$ and $M_{i+1}$ are still "acceptable", then steps 208 through 216 are repeated, with N and M growing monotonically with each cycle and the approximation of Equation. (3) improving with each cycle. When the i+1 st value of N and M finally fail the size test of steps 215 or 216, then we know that the immediatly prior values $M_i$ and $N_i$ are the best "acceptable" values. A numerical example, by way of illustration, is shown in FIG. 6A.

The goal of the approximation proceedure is to produce as good an approximation as possible, in an environment where $N_{max}$ and $M_{max}$ are as small as possible. Yet the electrical dynamics of the PLL can depend on the size of N, and a particular calculated $N_i$ might actually be too small for a given PLL design, and so once the designer has chosen values for $N_{max}$ and $M_{max}$, and built a calculation proceedure according to the teaching of this invention to produce an $N_i < N_{max}$ and an $M_i < M_{max}$, it may in fact be desirable to actually increase the size of particular $N_i$ and $M_i$ values before sending them to the counters. For example, if $M_{max} = 1000$ and $N_{max} = 1500$, then for some value of $F_{out}$, it might happen that $M_i = 27$ and $N_i = 39$ and $M_{i+1} = 1070$ and $N_i = 1545$. Here both $M_{i+1}$ and $N_{i+1}$ are too large to be "acceptable", so one must use $N_i$ and $M_i$, yet they in turn are both quite small compared to their maximum possible values (the values for which the rest of the PLL must be designed electrically), and this size difference could lead to instabilities or other problems with optimum PLL operation.

Thus a final processing step (250) can be helpful. Here, both $M_i$ and $N_i$ are multiplied by an integer s, where s = the lesser of $\text{int}\{M_{max}/M_i\}$ and $\text{int}\{N_{max}/N_i\}$. By this definition of s, it will always be true that $s*M_i < M_{max}$, and $s*N_i < N_{max}$, so $s*M_i$ and $s*N_i$ are also "acceptable", but can be much larger than $N_i$ and $M_i$ and much closer to $N_{max}$ and $M_{max}$. In the above example, s = 37 and so $s*M_i = 37*27 = 999 < M_{max}$, and $s*N_i = 37*39 = 1443 < N_{max}$. Note that since both $M_i$ and $N_i$ have been multiplied by the same integer, their ratio remains the same, and hence $F_{out}$ remains the same, and the quality of the approximation to $F_{req}/F_{ref}$ remains the same.

Even with the above scheme, one might get variations in the size of say $N_i*$s as large as a factor of two. In the highest performance versions of the PLL (70), it might be considered necessary to modify the amplifier or filter or both of means 80 to further compensate for this remaining size variation in $N_i*$s. Such active alterations to the amplifiers, integrators and or filters of a PLL are not widely used (due to cost and complexity reasons), but they have been described in the prior art, and could be used in combination with the present invention. An example of a calculation according to the single clock version of the invention (without step 205) is shown in FIG. 6A.

Figure 5:
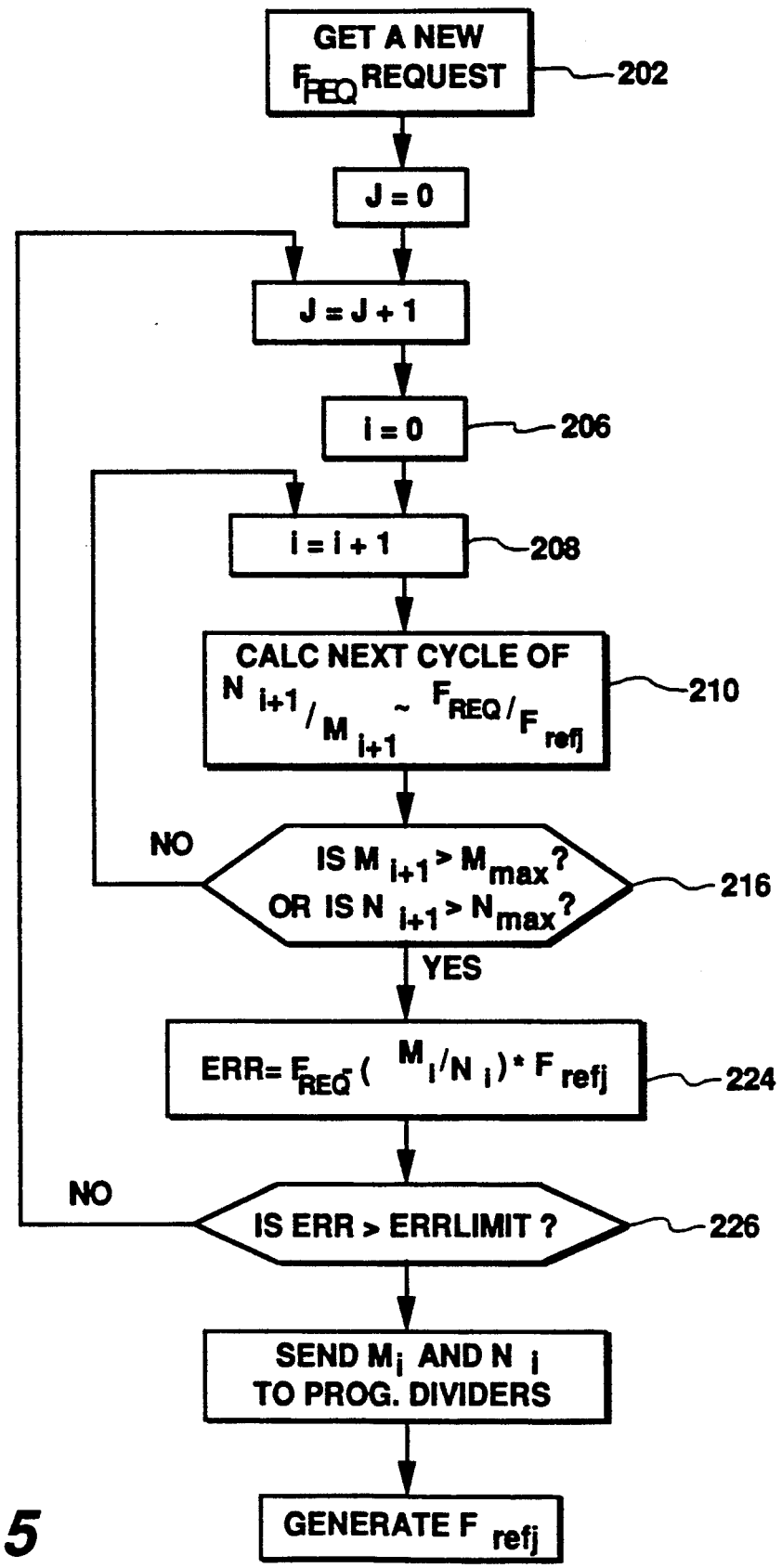
FIG. 5 is a flow chart description of the calculation proceedure for the adjustable reference embodiment of the invention.

FIG. 5 shows a flow chart of the adjustable reference version of the invention. In this version, more than one value for the reference frequency $F_{reij}$ is available and known to the calculation means 110. This allows the proceedure of the single clock version to be run, according to the above teaching (steps 206–216) based on one value of $F_{reij}$, and then the size of the error of that run to be calculated (step 224):

$$err_{ij} = F_{req} - F_{out} = F_{req} - (N_i/M_i)*F_{refj} \qquad (4)$$

If said error is larger than a predetermined error limit (step 226), then a new value of $F_{refj+1}$ is introduced and the steps 206–216 are repeated, leading to new values of $M_i$ and $N_i$. Again, the error is calculated according to Equation. (4), and if said error is again too large, a third $F_{refj+2}$ is invoked. Eventually, either an $err_{ij}<$ errlimit is found, or the list of $F_{ref}$'s is exhausted, whereupon the smallest error j & i combination could be used. Other similar strategies for picking the best of several $err_j$'s with the least amount of effort will be obvious to those skilled in the art. For example, and in the prefered embodiment of the adjustable reference version of the invention, the list of $F_{ref}$'s is long enough and "errlimit" is chosen carefully enough, that for all values of $F_{req}$, there will be some $F_{refj}$ that will lead to an $err_j$ that is less than errlimit before the list is exhausted.

FIG. 6A and FIG. 6B show two very simple calculations which by way of example, point out the kind of resolutions one might see in the two embodiments of the invention. The first example (FIG. 6A) shows the process when the reference is of the single timebase form (FIG. 3A). The second example (FIG. 6B) shows a multiple $F_{ref}$ embodiment (FIG. 3B or FIG. 3C), with consequent improvement in resolution. In the first example, assume $F_{ref}=10.0$ Mhz=constant, and in both examples, assume that the maximum allowed sizes for N and M are: $N_{max}=6000$, and $M_{max}=3000$. Also, in this example, let $F_{req}=19.99811$ MHz. The calculation means 110 produces the $i=1$ approximation of $N_1=2$ and $M_1=1$, with an error of ~1890 Hz. The $i=2$ values are $N_2=10581$ and $M_2=5291$, with essentially zero error, but $N_2$ and $M_2$ both fail the size test, so we must back up and use $M_1=1$ and $N_1=2$. The error is 95 ppM, which is quite close to the requested frequency, and is good enough for many applications. For example, it might be fine for frequency hopping systems, where a modest amount of resolution is required and so is a small $M_{max}$ (for speed considerations), and where the accuracy could be quite acceptable because the receiver would be using the same exact procedure to synthesize its receiving frequencies, and would therefore have the same "error".

In FIG. 6B, with the adjustable reference added, there would be a plurality of $F_{ref}$'s available, each known to the calculation means 110. The list (in this simplified example) might include: 10.000000 MHz (j=1), 10.001100 Mhz (j=2), 10.000930 MHz (j=3), etc. The first stage of the process (j=1) would proceed exactly as shown in FIG. 6A above. If, however, the ~1.9 KHz error was considered too large, then a new $F_{refj}$ value (j=2) would be selected: $F_{ref2}=10.001100$ MHz. The approximation portion of the calculation would be repeated, with the results shown in FIG. 6B. There, both i=1 and i=2 give "acceptable" $N_i$ and $M_i$ values, but at i=3, both $M_3$ and $N_3$ are too large, so i=2 is used, with the error of only 0.43 Hz or 0.022 ppMl—an even better result than FIG. 6A above, and more suited to a wide spectrum of users.

The present invention uses a form of Euclid's algorithm to perform the rational fraction approximation calculation of step 210. A schematic flow chart showing the steps of one version of Euclid's algorithm is shown in FIG. 7. Other versions of this old algorithm are known in the art of number theory; each has its own advantages, and a designer using the teaching of the present invention could use any version that best fit the circumstances of the particular embodiment. The version of FIG. 7 can perhaps best be understood by considering a particular calculation by way of example, as illustrated in FIG. 8, wherein a series of integer fraction approximations are calculated for the ratio: $F_{req}/F_{ref}=A/B=60.45204/10.00=6.045204/1.000$.

First, at step 302, values are initialized as shown in FIG. 7. In a prior step not shown, A and B can first be "normalized", to make the calculation easier for a simple calculation means 110. For the preferred embodiment, this can mean both A and B are multiplied by a large positive integer, such that A and B can be treated as large integers and hence have integer arithmetic performed on them. The resolution of the arithmetic should always be greater than the desired resolution of the synthesizer, so the former does not limit the latter. In FIG. 8, the "large positive integer" is $1 \times 10^6$. The next step, 304, is the first step of the cycled portion of the proceedure; the variables $X_i$ and $Y_i$ which were the $i^{th}$ integer approximation to A/B, are stored in variables C and D. Also, the cycle counter i is incremented. In step 306, the current value of A is divided by the current value of B, and the integer portion of the result is stored in T, while the remainder portion of the result is stored in variable A (replacing what was there). Next, the $i+1^{th}$ values for $X_{i+1}$ and $Y_{i+1}$ are calculated (310) according to $X_{i+1}=X_i*T+E$ and $Y_{i+1}=Y_i*T+F$. Then in 312, E and F take on the previous values of $X_i$ and $Y_i$ (by means of C and D earlier in step 304). Finally, the values in A and B are swapped (314). Step 316 shows a block wherein tests might be performed that relate to the sizes of $X_{i+1}$ and $Y_{i+1}$ though these tests could come at any time after the new $X_{i+1}$ and $Y_{i+1}$ were calculated in step 310 (though obviously the steps 312 and 314 need to be carried out at some point, if another cycle of the proceedure is required). The calculation concludes at 320, and here, after $X_{i+1}$ or $Y_{i+1}$ have first failed a size test, it is the immediately previous values $X_i$ and $Y_i$ that provide the best "acceptable" approximation: $A/B = X_i/Y_i$.

As is known from number theory, the error of the $i^{th}$ approximation $N_i/M_i$ is $<1/M_i^2$. Prior synthesizer art describes a synthesizer based on a different kind of approximation, and wherein M=N+K (K small), and resolution is approximately equal to $1/M^2$. An advantage of the present invention, is that in a Euclid approximation, the inequality "$err<1/M_i^2$" is real—it does not say "err $\sim 1/M_i^2$". In other words, the maximum error can be as large as $1/M_i^2$, but often it is much smaller, and this mathematical fact has practical consequences that can be embodied in real hardware. To understand this better, consider an example where $F_{req}=15.01$ MHz and $F_{ref}=10.00$ MHz. The proceedure of the present invention will calculate an approximation $N_i/M_i=1501/1000$ with an error of $err=F_{req}-(N_i/M_i)*F_{ref}=15.01-(1501/1000)*10.00=15.01-15.01=0$. Thus here the error (=zero) is indeed less than $1/1000^2=1$ ppM, but it is most emphatically not approximately equal to $1/M_i^2$. The present invention keeps that inequality strongly in mind, in that after making an approximation $N_i/M_i$, and even where it happens that $M_i$ is close to the limit of $M_{max}$ and hence $1/M_i^2$ is at a minimum value, that error$=err_i<1/M_i^2$ is not necessarily at a minimum value. After calculating an estimate of the error and comparing it to a desired error limit, the second form of the present invention can select a new $F_{refj}$, and do another approximation calculation: $N_j/M_j$ where $M_j$ may even be smaller than the earlier $M_i$, yet where the error: $err_j=F_{req}-(N_j/M_j)*F_{refj}$ is actually less than $err_i$. Thus by using a calculation proceedure according to the present invention and an adjustable reference, an error considerably smaller than $1/(M_{max})^2$ is achievable (at the expense of the necessity for additional calculations and an adjustable reference).

There has thus been shown and described a novel frequency generator which fulfills all the objects and advantages sought therefor. Many changes, modifications, variations and other uses and applications of the subject invention will, however, become apparent to those skilled in the art after considering this specification and the accompanying drawings which disclose the preferred embodiment thereof. All such changes, modifications, variations and other uses and applications which do not depart from the spirit and scope of the invention are deemed to be covered by the invention which is limited only by the claims which follow.

GLOSSARY

I have tried to use standard definitions for all of my text, but I do use a few terms with a more specific meaning-mostly to be able to use a phrase over and over, instead of having to use a whole paragraph over and over. These include:

"ACCEPTABLE" VALUES: are divider values M, N etc which are smaller than some pre-defined limit values $M_{max}$, $N_{max}$, etc. The limit values are at most the size of their respective programmable counters (which have some maximum division capability), but they could also be much smaller, depending on other constraints such as various PLL dynamic characteristics that are to be optimized, such as noise, reference feedthrough, time of lock, etc.

COMPARISON MEANS: is essentially the phase detector, integrator and filter. It also would include a frequency detector or (as is most common) a hybred of the two. I've also lumped in here (for the sake of brevity) the integrators, filters, etc, necessary to condition the control signal before it is shipped to the controllable oscillator.

DESIGN EQUATION: here is used to name the equation which relates the four PLL variables $F_{in}$, T,U,$F_{out}$; where $F_{in}$ is the frequency of the signal coming into the PLL (often $F_{in}=F_{ref}$). T is the division value for the divider receiving $F_{in}$, $F_{out}$ is the output frequency of the VCO of the PLL, and U is the division value for the feedback divider which divides $F_{out}$. The output therefore of the first divider is $F_{out}/T$, and the output of the feedback divider is $F_{out}/U$, and since these signals are fed to the phase detector and the PLL action in lock forces them to be equal, we have $F_{in}/T=F_{out}/U$, or equivalently $F_{out}=(U/T)*F_{in}$, which is what I call the design equation.

EUCLID'S ALGORITHM: possibly the oldest known algorithm (prior art with a vengence!). It has many uses in various forms, including finding GCD's and LCD's, but as here, it can be used to produce rational fraction approximations to a given ratio. Note that there are several modern versions of this algorithm, that are optimized for various kinds of processor or size of input number.

EXT. IN/INT. OUT: stands for "external timebase input" and "internal timebase output". These are signal inputs and outputs that show up in many synthesizer products. They are quite useful in allowing respectively: the use of a higher stability external timebase whose stability, drift, etc is even better than the $F_t$ timebase included with the standalone synthesizer, and the use of an "int. out" signal to synchronize an external device (for example, a counter-timer) to the synthesizers internal timebase. Both these signals and the hardware to switch them in and out and support the feature is very old prior art.

LOCK: When a PLL is locked, I mean: its inputs and outputs are defined by the design equation. Though much prior art (and any number of patents) concern themselves with the details of optimally going from an unlocked state to a locked state, and further, how to optimize the locked state itself, such is not the subject matter of the present invention.

PPL: phase locked loop. Though a PLL can contain as little as a controllable oscillator and a comparison means with no dividers, when I use the term PLL here to refer to a PLL with a reference input, a first programmable divider that divides the reference input, a comparison means with one of its inputs connected to the output of the first divider, a controllable oscillator, a second programmable divider whose input is connected to said oscillator, and whose divided output is connected to the other input of the comparison means, so that the comparison means can provide a correction signal to the controllable oscillator of a strength and polarity to bring the loop into lock. I also include in this term frequency locked loops, hybred phase/freq. locked loops, etc.

int(A) is a math expression meaning "integer value of A", so int(7.41)×7 and int(3/2)×1, etc.

PROGRAMMABNLE DIVIDER: this is any divider that will divide by a range of integers, and where the division is controllable by the external control and calculation means. It includes binary, decimal, dual and multi-modulus counter, counters within ASIC's etc.

STANDARD FREQUENCY: usually 1, 5 or 10 MHz—these are the standard frequencies that a typical synthesizer would expect to use as an external reference or to provide as an "int. out" In the 60's, 1 MHz was more popular, but for a long time now 10 MHz has been the most common.

VCXO: Voltage controlled crystal oscillator. This is a controlled oscillator, based on a crystal as the resonant element. It can be used as the controllable oscillator in a PLL. Its characteristics include a very good noise spectrum (almost, but not quite, as quiet as a plain crystal oscillator), but only a very narrow frequency range of oscillation (~50 to perhaps 300 ppM, depending on how badly noise levels are to be impacted).

I claim:

1. In a frequency synthesizer of a type employing a reference means, and at least one phase locked loop (PLL) locked thereto, said PLL including an output oscillator responsive to a control signal, and having an output signal of frequency $F_{out}$, said synthesizer further including calculation and control means, operatively connected to said PLL, a method for generating said output signal, having a low noise, adjustable frequency, which is a close approximation to a requested frequency $F_{req}$, said method comprising the steps of:

(a) receiving a request for an output frequency $F_{req}$;

(b) providing a reference signal $F_{ref}$ by means of said reference means;

(c) calculating a plurality of integer pairs $M_i, N_i$ that, taken as a ratio $M_i/N_i$, are approximations to the ratio $F_{ref}/F_{req}$;

(d) selecting a pair $M_k, N_k$, from among said plurality of pairs, with the largest value of $N_k$ wherein said $N_k$ is less than a pre-specified maximum value $N_{max}$ and wherein $M_k$ is less than a pre-specified maximum value $M_{max}$;

(e) sending said integer $M_k$ to a first programmable divider responsive to said reference signal $F_{ref}$, wherewith to program said programmable divider, and sending said integer $N_k$ to a second programmable divider responsive to said output signal $F_{out}$ wherewith to program its divide value;

(f) dividing said reference signal $F_{ref}$ by said integer $M_k$ in said first programmable divider, to produce a divided signal ($F_{ref}/M_k$) and dividing said output signal $F_{out}$ by said second integer $N_k$ in said second programmable divider, to produce a second divided signal ($F_{out}/N_k$);

(g) comparing said two divided signals in a comparison means, to produce said first control signal that is responsive to the difference between $F_{ref}/M_k$ and $F_{out}/N_k$;

(h) controlling said output oscillator by means of said control signal to cause said PLL to lock, and whereby $F_{out} = (N_k/M_k)*F_{ref}$.

2. The method recited in claim 1, wherein step (c) comprises a calculation based on a form of Euclid's Algorithm.

3. The method recited in claim 2 wherein said fixed reference source $F_t$ is adapted to oscillate at a standard frequency, and where said fixed reference source further comprises means to allow an external reference input and a reference output signal responsive to said fixed reference source $F_t$.

4. The method recited in claim 3 where step (d) further comprises replacing said $M_i$ and $N_i$ values by values $s*M_i$ and $s*Ni$ respectively, where integer s is the lesser of int($M_{max}/M_i$) and int($N_{max}/N_i$), and whereby both $s*M_i$ and $s*N_i$ are larger than $M_i$ and $N_i$, but still less than $M_{max}$ and $N_{max}$ respectively.

5. In a frequency synthesizer of a type employing an adjustable reference means, and at least one phase locked loop locked thereto, said PLL including an output oscillator responsive to a control signal, and having an output signal of frequency $F_{out}$, a method for generating said output signal, having a low noise, adjustable frequency, which is a close approximation to a requested frequency $F_{req}$, said method comprising the steps of:

(a) receiving a request for an output frequency $F_{req}$;

(b) selecting a value $F_{refj}$ within the frequency range of said adjustable reference means;

(c) calculating a plurality of integer pairs $M_i, N_i$ that, taken as a ratio $M_i/N_i$, are approximations to the ratio $F_{refj}/F_{req}$;

(d) selecting a pair $M_k, N_k$, from among said plurality of pairs, with the largest value of $N_k$ and wherein said $N_k$ is less than a pre-specified maximum value $N_{max}$ and wherein $M_k$ is less than a pre-specified maximum value $M_{max}$;

(e) calculating a value, responsive to the equation: $err = F_{req} - F_{out} = F_{req} - (N_k/M_k)*F_{refj}$;

(f) comparing said calculated value to a pre-selected limit value, and upon the condition that said calculated value is larger than said limit, selecting a new value of $F_{refj}$, and repeating steps (b) through (f); and upon the condition that said calculated value is smaller than said limit, proceeding to step (g);

(g) adjusting said adjustable reference means to generate a reference signal of frequency $F_{refj}$, wherein $F_{refj}$ is the reference frequency value in use when step (f) was satisfied;

(h) generating an output signal $F_{out}$ in an output oscillator in said PLL, said oscillator responsive to a first control signal;

(i) sending said integer $M_k$ to a first programmable divider responsive to said reference signal $F_{refj}$, wherewith to program said programmable divider, and sending said integer $N_k$ to a second programmable divider responsive to said output signal $F_{out}$, wherewith to program said programmable divider;

(k) dividing said reference signal $F_{refj}$ by said integer $M_k$ in said first programmable divider, to produce a divided signal ($F_{refj}/M_k$), and dividing said output signal $F_{out}$ by said second integer $N_k$ in said second programmable divider, to produce a second divided signal ($F_{out}/N_k$);

(l) comparing said two divided signals in a comparison means, to produce said control signal that is responsive to the difference between $F_{refj}/M_k$ and $F_{out}/N_k$;

(m) controlling said output oscillator by means of said control signal to cause said PLL to lock, and whereby $F_{out} = (N_k/M_k)*F_{refj}$.

6. The method recited in claim 5, wherein step (c) comprises a calculation based on a form of Euclid's Algorithm.

7. The method recited in claim 6 where step (g) further comprises replacing said $M_i$ and $N_i$ values by values $s*M_i$ and $s*Ni$ respectively, where integer s is the lesser of int($M_{max}/M_i$) and int($N_{max}/N_i$), and whereby both $s*M_i$ and $s*N_i$ are larger than $M_i$ and $N_i$, but still less than $M_{max}$ and $N_{max}$ respectively.

8. The method recited in claim 7, wherein said adjustable reference means comprises more than one stable reference oscillator, oscillating at more than one stable frequency, and a selector means operatively connected to each of said stable oscillators, and wherein:

step (b) comprises selecting one among said plurality of reference frequencies, and;

step (g) comprises commanding said selector means to select the corresponding signal from said selected oscillator.

9. The method recited in claim 8 wherein one of said stable reference oscillators is adapted to oscillate at a standard frequency, and wherein:

step (b) comprises selecting said standard frequency reference frequency as a first choice, and other of said frequencies as subsequent choices if required by step (f).

10. The method recited in claim 7, wherein said adjustable reference means is a single oscillator, with a variable frequency control, and wherein:

step (b) comprises selecting a $F_{refj}$ value within the range of said variable frequency control, and;

step (g) comprises commanding said variable frequency control to cause said adjustable reference means to produce said frequency $F_{refj}$.

11. The method recited in claim 7 wherein said adjustable reference means comprises a PLL including a fixed reference source of a known type, of frequency $F_t$; a third programmable divider dividing said signal $F_t$ by an integer M', and producing divided signal $F_t/M'$; a second adjustable oscillator of output frequency $F_{refj}$; a fourth programmable divider dividing said output signal $F_{refj}$ by a second integer N', and producing second divided signal $F_{refj}/N'$; and a comparison means to compare said divided signals $F_t/M'$ and $F_{refj}/N'$ and produce a control signal responsive to the difference therebetween, and therewith to control said second adjustable oscillator to minimize said difference and cause said loop to lock; and a memory means containing at least two pair of precalculated values $M_j$ and $N_j$, a control means to load said pairs into said programmable dividers, and wherein:

step (b) recited in claim 7 consists of choosing one of said pairs of $M_j$ and $N_j$, thereby choosing a numerical value $F_{refj} = (N_j'/M_j') * F_t$, and;

step (g) recited in claim 7 consists of causing said control means to load said $M_j'$ and $N_j'$ values into said third and fourth programmable dividers, and whereby after lock, the reference frequency $F_{refj}$ stands to said fixed reference $F_t$ in the relation described by the equation: $F_{refj} = (N_j'/M_j') * F_t$.

12. The method recited in claim 11 wherein said fixed reference source $F_t$ is adapted to oscillate at a standard frequency, and where said fixed reference source further comprises means to allow an external reference input and a reference output signal responsive to said fixed reference source $F_t$.

13. The method recited in claim 12 where said second oscillator has a narrow range of output frequencies, offset from and avoiding any simple multiple of said fixed reference $F_t$, and wherein step (b) further comprises choosing among a collection of pairs $M_j'$, $N_j'$ wherein the values of said pairs are restricted whereby their ratios fall within said narrow offset range.

* * * * *